(12) United States Patent
Lin et al.

(10) Patent No.: US 11,532,439 B2
(45) Date of Patent: Dec. 20, 2022

(54) ULTRA-DENSE FERROELECTRIC MEMORY WITH SELF-ALIGNED PATTERNING

(71) Applicant: Intel Corporation, Santa Clara, CA (US)

(72) Inventors: Chia-Ching Lin, Portland, OR (US); Sou-Chi Chang, Portland, OR (US); Nazila Haratipour, Hillsboro, OR (US); Seung Hoon Sung, Portland, OR (US); Ashish Verma Penumatcha, Hillsboro, OR (US); Jack Kavalieros, Portland, OR (US); Uygar E. Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 743 days.

(21) Appl. No.: 16/296,085

(22) Filed: Mar. 7, 2019

(65) Prior Publication Data

US 2020/0286687 A1 Sep. 10, 2020

(51) Int. Cl.
| | | |
|---|---|---|
| G11C 16/10 | (2006.01) | |
| H01G 7/06 | (2006.01) | |
| G11C 11/22 | (2006.01) | |
| H01L 27/108 | (2006.01) | |
| H01L 49/02 | (2006.01) | |

(52) U.S. Cl.
CPC .............. *H01G 7/06* (2013.01); *G11C 11/221* (2013.01); *H01L 27/10805* (2013.01); *H01L 28/60* (2013.01)

(58) Field of Classification Search
CPC ... H01G 7/06; G11C 11/221; H01L 27/10805; H01L 28/60; H01L 28/56; H01L 27/11507
See application file for complete search history.

(56) References Cited

U.S. PATENT DOCUMENTS

| 2004/0185634 A1 | 9/2004 | Lim et al. |
| 2006/0273366 A1* | 12/2006 | Ko .................. H01L 21/32139 |
| | | 257/295 |

(Continued)

FOREIGN PATENT DOCUMENTS

KR 100533970 5/2006

OTHER PUBLICATIONS

Extended European Search Report from European Patent Application No. 20155331.0 dated Jul. 6, 2020, 19 pgs.

*Primary Examiner* — Xiaochun L Chen
(74) *Attorney, Agent, or Firm* — Essential Patents Group, LLP

(57) ABSTRACT

Described is an ultra-dense ferroelectric memory. The memory is fabricated using a patterning method by that applies atomic layer deposition with selective dry and/or wet etch to increase memory density at a given via opening. A ferroelectric capacitor in one example comprises: a first structure (e.g., first electrode) comprising metal; a second structure (e.g., a second electrode) comprising metal; and a third structure comprising ferroelectric material, wherein the third structure is between and adjacent to the first and second structures, wherein a portion of the third structure is interdigitated with the first and second structures to increase surface area of the third structure. The increased surface area allows for higher memory density.

20 Claims, 13 Drawing Sheets

(56) References Cited

U.S. PATENT DOCUMENTS

| 2007/0205449 | A1 | 9/2007 | Ishida |
| 2010/0187584 | A1 | 7/2010 | Matsuda |
| 2020/0286984 | A1 | 9/2020 | Chang et al. |

* cited by examiner

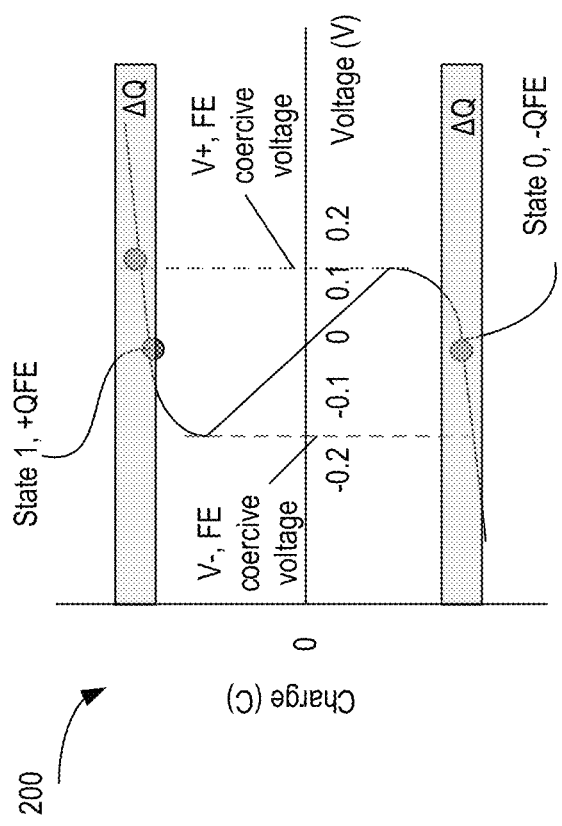
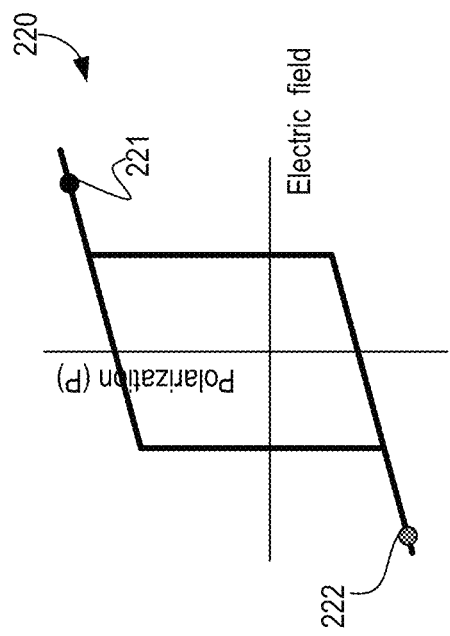
Fig. 2A
Fig. 2B

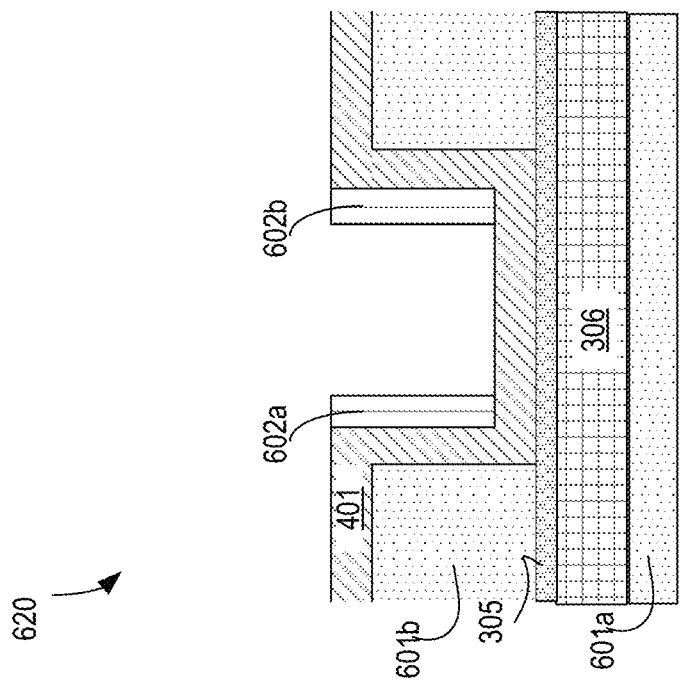
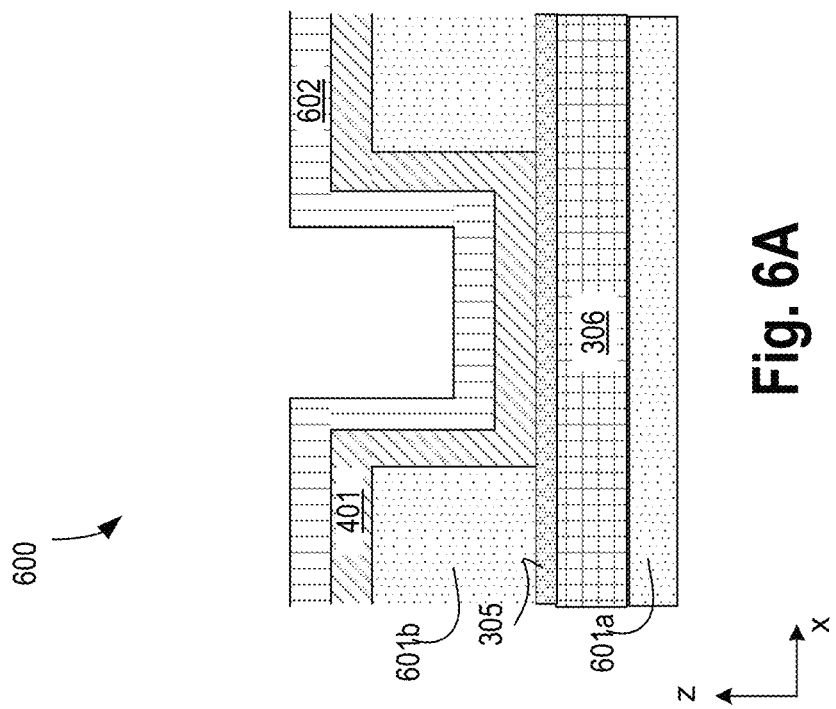

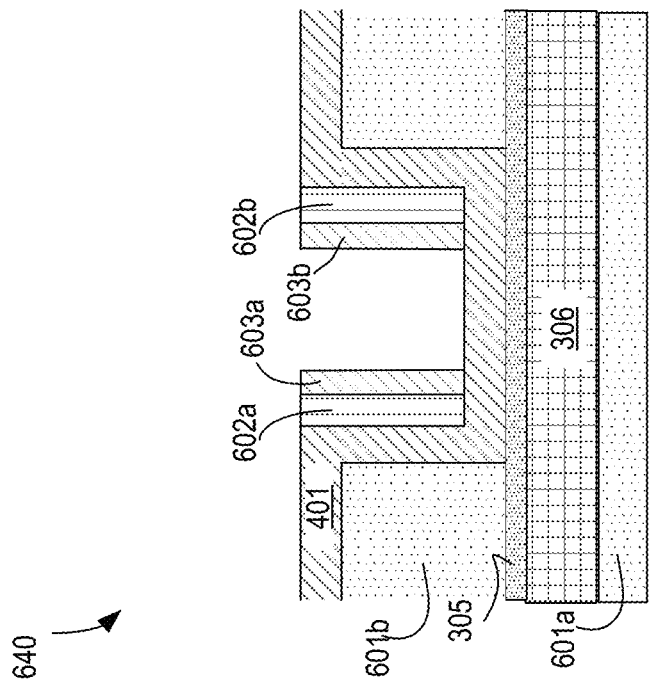
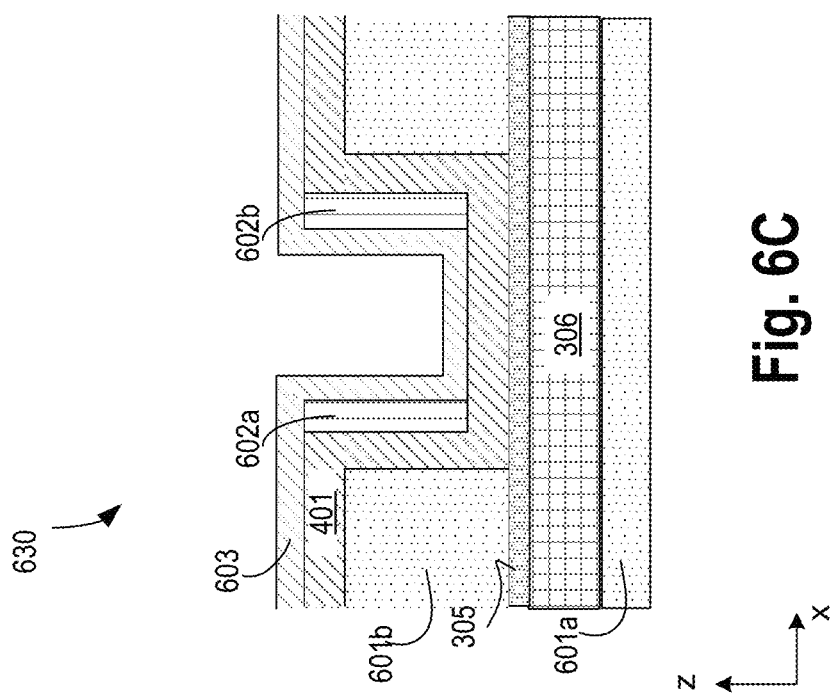
Fig. 6D
Fig. 6C

ULTRA-DENSE FERROELECTRIC MEMORY WITH SELF-ALIGNED PATTERNING

BACKGROUND

Devices such as high charge capacity capacitors (e.g., metal-insulator-metal (MIM) capacitors) for backend can be formed as passive circuit elements or transistors (e.g., metal-oxide-semiconductor (MOS) transistors) for frontend as active circuit elements. Passive circuit elements can be used to provide charge storage and sharing, while active circuit elements can be used to enable low voltage and high current power supply. Traditional ferroelectric capacitors have low retention durations. New materials and method are desired to make capacitors with longer retentions, higher reliability, and high storage capacity.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2A illustrates a plot showing charge versus voltage function of the FE-Cap, its memory states, and imprint charge.

FIG. 2B illustrates a plot showing hysteresis property of ferroelectric material, in accordance with some embodiments.

FIGS. 6A-L illustrate cross-sections showing the process of fabricating a COB with interdigitated ferroelectric structure, according to some embodiments of the disclosure.

DETAILED DESCRIPTION

Figure 1:
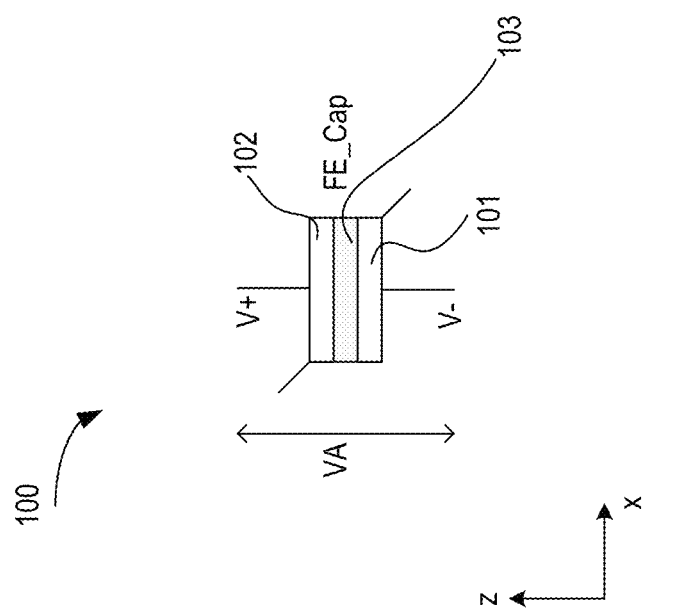
FIG. 1 illustrates a schematic of a ferroelectric capacitor (FE-Cap).

Described is an ultra-dense ferroelectric memory. The memory is fabricated using a patterning method that applies atomic layer deposition (ALD) with selective dry and/or wet etch to increase memory density at a given via opening. A ferroelectric (FE) capacitor in one example comprises: a first structure (e.g., first electrode) comprising metal; a second structure (e.g., a second electrode) comprising metal; and a third structure comprising ferroelectric material, wherein the third structure is between and adjacent to the first and second structures, wherein a portion of the third structure is interdigitated with the first and second structures to increase surface area of the third structure. The increased surface area allows for higher memory density. The scheme of various embodiments uses low cost lithography methods to push via pitch. The fabrication process is self-aligned which for a given capacitor-over-bitline (COB) via opening, increases surface area of the ferroelectric material. In one example, the surface area increases three times over surface area of a traditional COB dielectric. Due to large surface area improvement at given via opening, a high-aspect-ratio via may not be needed, in some examples. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. In some case, scaling to another process technology node also results into upsizing devices and their layout. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1 illustrates a schematic of a ferroelectric capacitor (FE-Cap) 100. FE-cap 100 generally comprises two metal layers, 101 and 102, and ferroelectric (FE) material 103 coupled between them. Unlike a normal dielectric based capacitor, a ferroelectric capacitor uses polarization charge to store the memory states, where positive and negative polarization charge indicates state "1" or "0".

FIG. 2A illustrates plot 200 showing charge versus voltage function of the FE-Cap, its memory states, and imprint charge. Here, x-axis is voltage and y-axis is charge sored in FE material 103. To switch an FE-cap, the applied FE-cap voltage VA is be higher than the ferroelectric coercive voltages (which behave as threshold voltages) when driven by a voltage source. For example, VA is greater than V+ for 0 to 1 state switching, and VA is less than V− for 1 to 0 state switching.

FIG. 2B illustrates plot 220 showing hysteresis property of ferroelectric material, in accordance with some embodiments. A ferroelectric material exhibits ferroelectricity, which is a property by which a spontaneous electric polarization can be revered by an electric field (e.g., applied voltage). When dielectric materials are polarized, the induced polarization 'P' is almost exactly proportional to the applied external electric field E. In such materials, the polarization is a linear function of the applied electric field or voltage. Ferroelectric materials, on the other hand, demonstrate a spontaneous non-zero polarization even when the applied electric field E is zero. As such, the spontaneous polarization can be reversed by an applied electric field in the opposite direction. This results in a hysteresis loop because the polarization of a ferroelectric material is dependent not only on the present electric field but also on its history. The hysteresis loop of plot 220 shows two stable operating positions for FE 103—position 221 and position 222. These two stable positions indicate that the direction of polarization can be switched (e.g., polled) from one to another and this changes the response of polarization to applied AC voltage.

Figure 3:
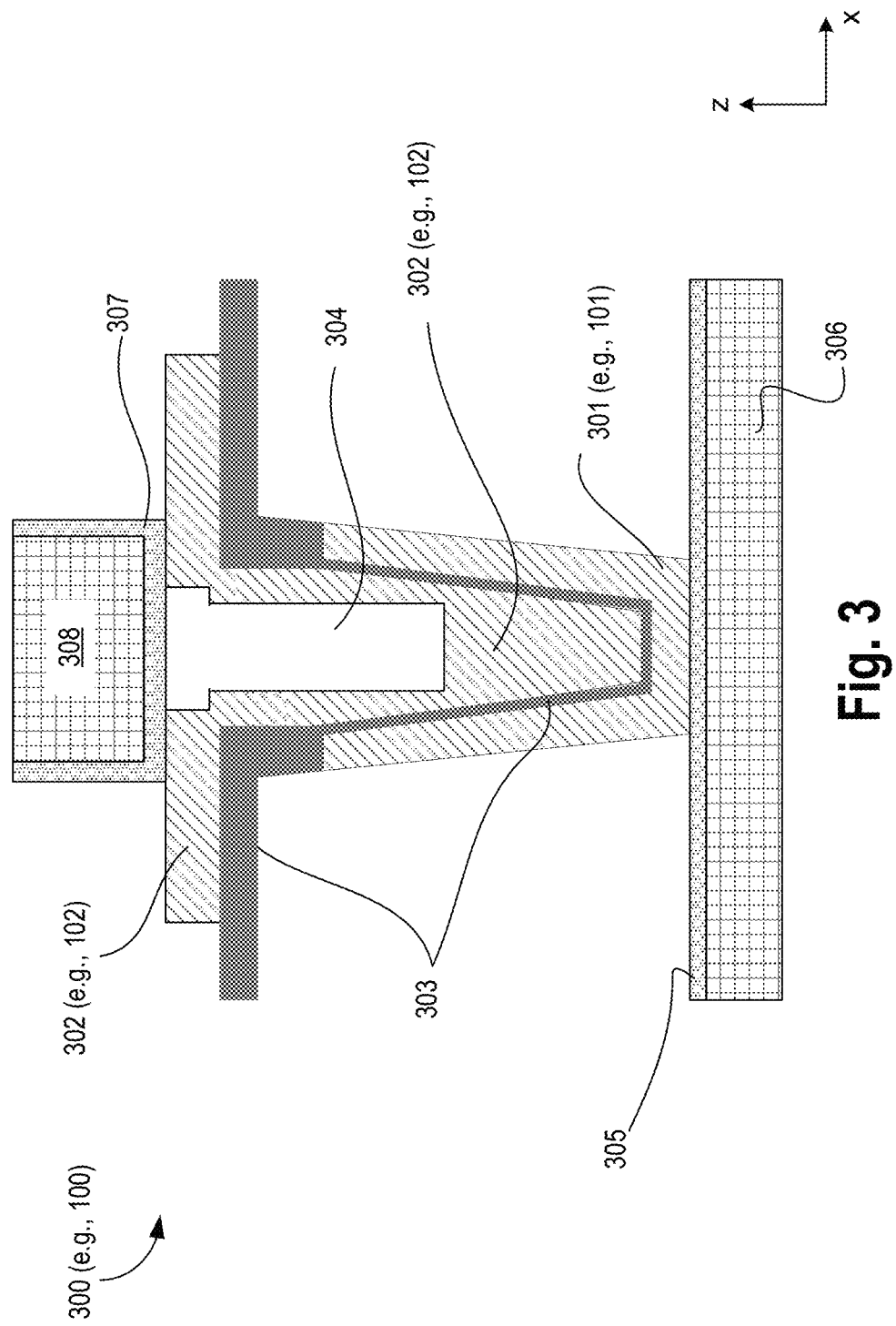
FIG. 3 illustrates a cross-section of a capacitor over bit-line (COB) with low surface area of ferroelectric material, in accordance with some embodiments of the disclosure.

FIG. 3 illustrates cross-section of a capacitor over bit-line (COB) 300 with low surface area of ferroelectric material, in accordance with some embodiments of the disclosure. Ferroelectric oxide thin film is a promising option for the next generation of embedded DRAM (Dynamic Random Access Memory) and high-density memory. One common integration scheme for ferroelectric memory is back-end COB structure. COB 300 comprises first electrode 301 (e.g., 101), second electrode 302 (e.g., 102), ferroelectric material 303, metal structure 304, first barrier 305, first interconnect 306, second barrier 307, and second interconnect 308. In COB configurations, in various embodiments, stacked memory capacitors are fabricated above an access transistor in the back-end interconnect portion of the process flow. First and second electrodes 301 and 302, respectively, comprise any metallic materials that have lattice constant smaller than 5.0 A. In a typical back-end COB structure, the memory density is limited by the lithography resolution of via opening 304.

The traditional way to increase memory density is to use high-cost lithography method such as multi-patterning or extreme ultraviolet lithography (EUV), or direct e-beam writing. Using these advance lithography methods to increase memory density is high-cost, results in low-yield, and these methods are not self-aligned processes. The density of back-end ferroelectric capacitor 300 is limited by the lateral opening of via 304 and pitch due to the restriction of lithography.

Figures 4A, 4B:
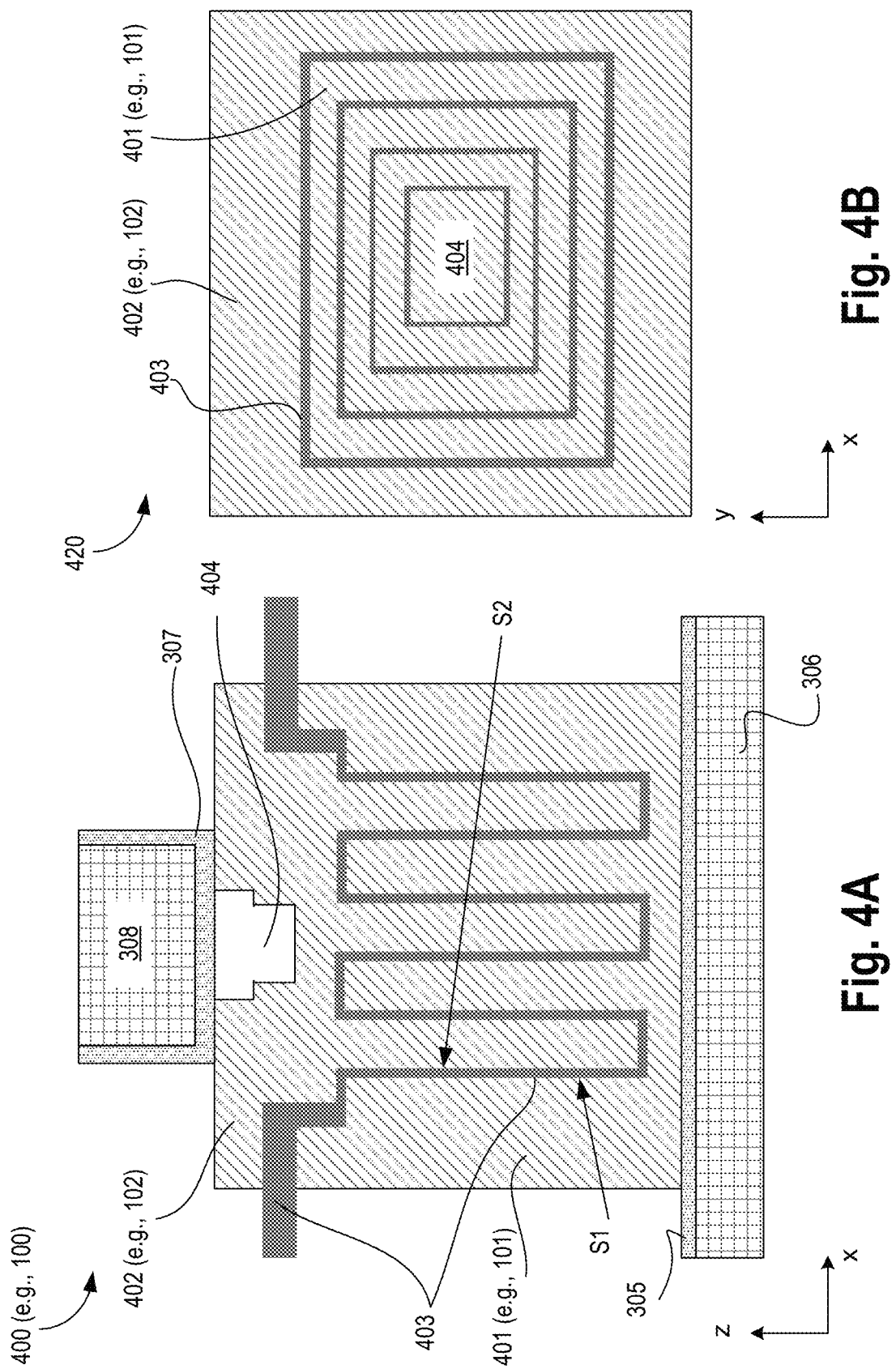
FIGS. 4A-B illustrate a cross-section and corresponding top view, respectively, of a COB with interdigitated ferroelectric structure to increase surface area of the ferroelectric structure, in accordance with some embodiments of the disclosure.

FIGS. 4A-B illustrate cross-section 400 and corresponding top view 420, respectively, of a COB with interdigitated ferroelectric structure to increase surface area of the ferroelectric structure, in accordance with some embodiments of the disclosure. ALD (Atomic Layer Deposition) with selective dry/wet etch is used to form the ferroelectric structure 403. As such, memory density at via opening 404 is dramatically increased. Compared to the ferroelectric structure 303 of FIG. 3, here ferroelectric structure 403 is interdigitated in a comb-like structure. For example, ferroelectric structure 403 is interdigitated between materials of first electrode 401 and second electrode 403. The interdigitating of ferroelectric structure 403 results in multiple surfaces for the comb-like structure.

For instance, each portion of ferroelectric structure that extends along the z-axis has an outer surface S1 and an inner surface S2. The ferroelectric structure that extends along the x-axis also has upper and lower surfaces. These surfaces face the different electrodes. For example, surface S1 is adjacent to first electrode 401 while surface S2 is adjacent to second electrode 402. By increasing the surface area of the ferroelectric material 403, capacitance of COB 400 is increased by multiple folds (e.g., 3-4 times) over the capacitance of COB 300.

Ferroelectric material 403 may include materials exhibiting ferroelectric behavior at thin dimensions. Examples of such materials include hafnium zirconium oxide (HfZrO, also referred to as HZO, which includes hafnium, zirconium, and oxygen), silicon-doped (Si-doped) hafnium oxide (which is a material that includes hafnium, oxygen, and silicon), germanium-doped (Ge-doped) hafnium oxide (which is a material that includes hafnium, oxygen, and germanium), aluminum-doped (Al-doped) hafnium oxide (which is a material that includes hafnium, oxygen, and aluminum), yttrium-doped (Y- doped) hafnium oxide (which is a material that includes hafnium, oxygen, and yttrium), lead zirconate titanate (which is a material that includes lead, zirconium, and titanium), barium zirconate titanate (which is a material that includes barium, zirconium and titanium), and combinations thereof. Some embodiments include hafnium, zirconium, barium, titanium, and/or lead, and combinations thereof. The thickness of ferroelectric material 403 in the comb-like structure along the x-axis for material extending along the z-axis is from a range of 2 nm to 20 nm.

In some embodiments, first and second interconnects 306 and 308 include one or more of: Cu, Al, graphene, CNT, Au, Co, or TiN. In some embodiments, barrier layers 305 and 307 are provided between the interconnects and electrodes. In various embodiments, these barriers are diffusion barriers and may comprise TaN. The electrodes 401 and 402 may include any suitable metallic material, which can be deposited by ALD. Examples of such material include one or more of: Cu, Al, graphene, CNT, Au, Co, or TiN. The metal via 404 can also have the same material as electrode 402. In some embodiments, metal via 404 includes one or more of: Cu, Al, graphene, CNT, Au, Co, or TiN.

Figure 5:
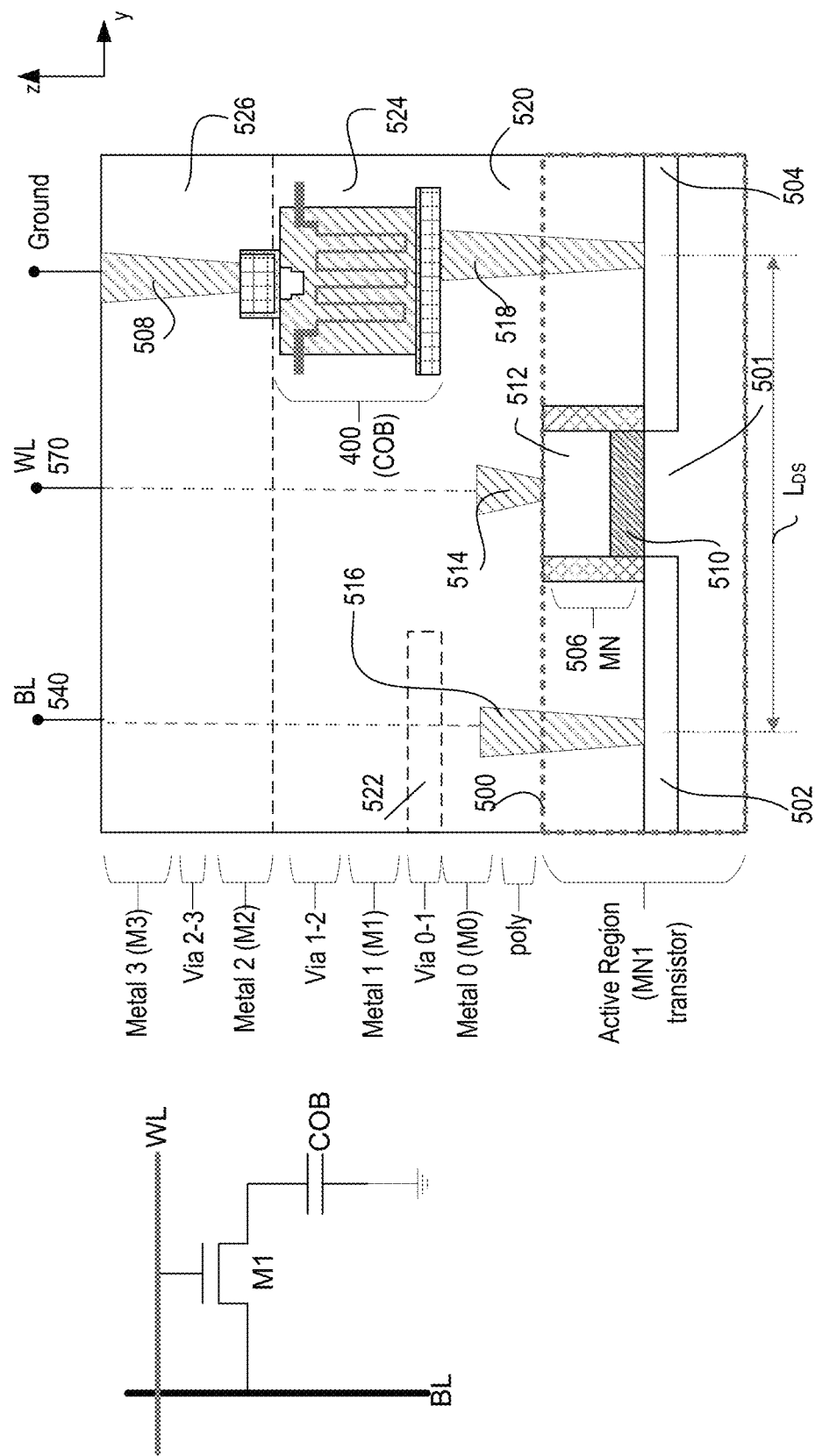
FIG. 5 illustrates a cross-section of an embedded dynamic random access memory (eDRAM) comprising COB with interdigitated ferroelectric structure, in accordance with some embodiments of the disclosure.
Figures 6E, 6F:
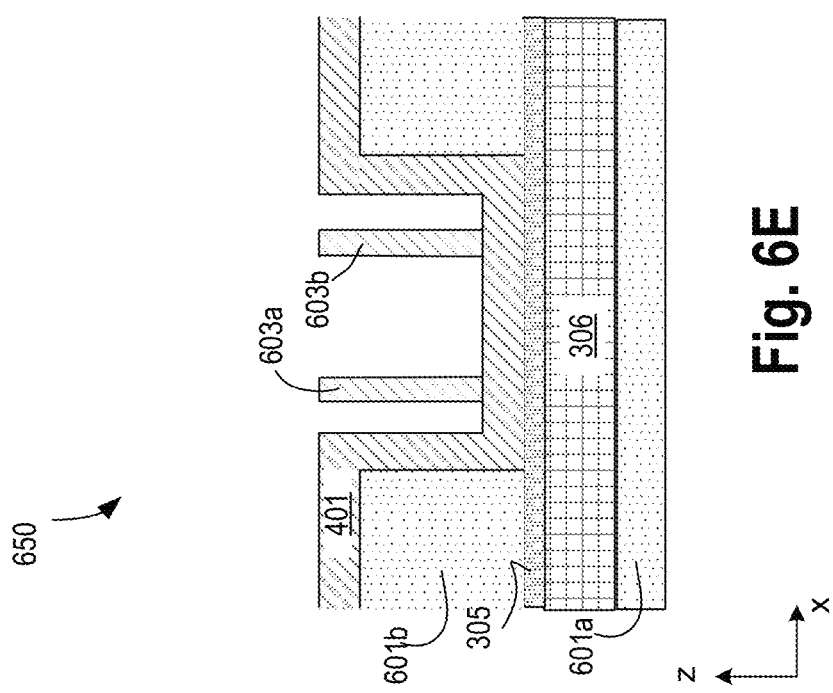
Figure 6H:
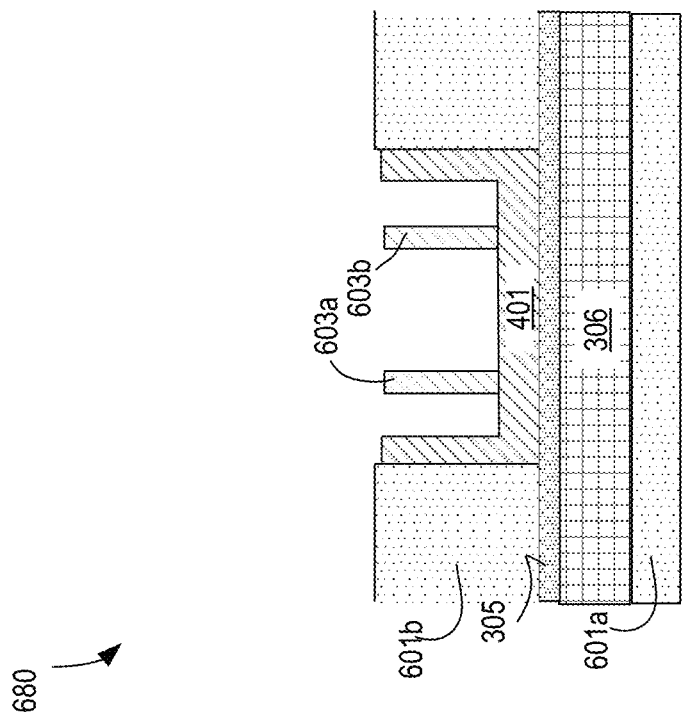
Figure 6G:
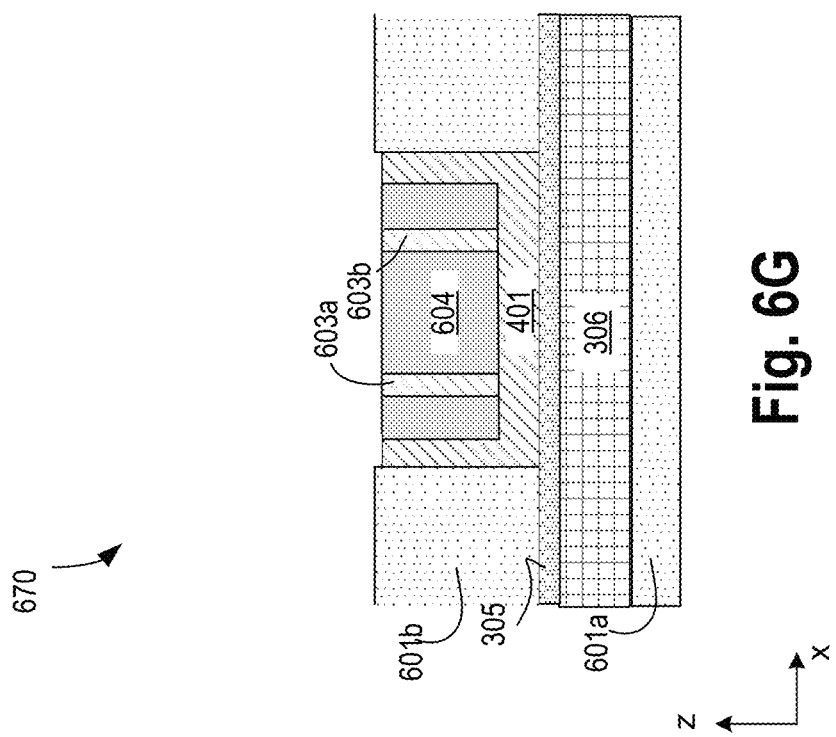
Figure 6J:
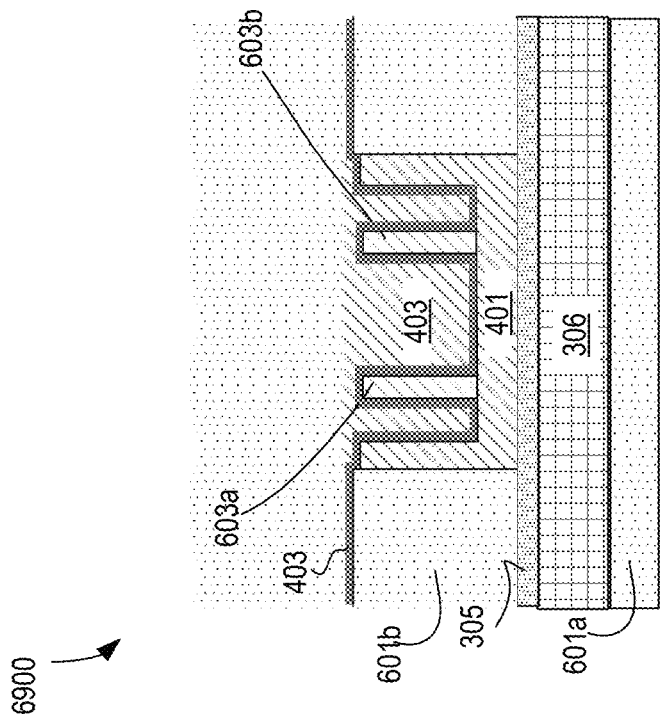
Figure 6I:
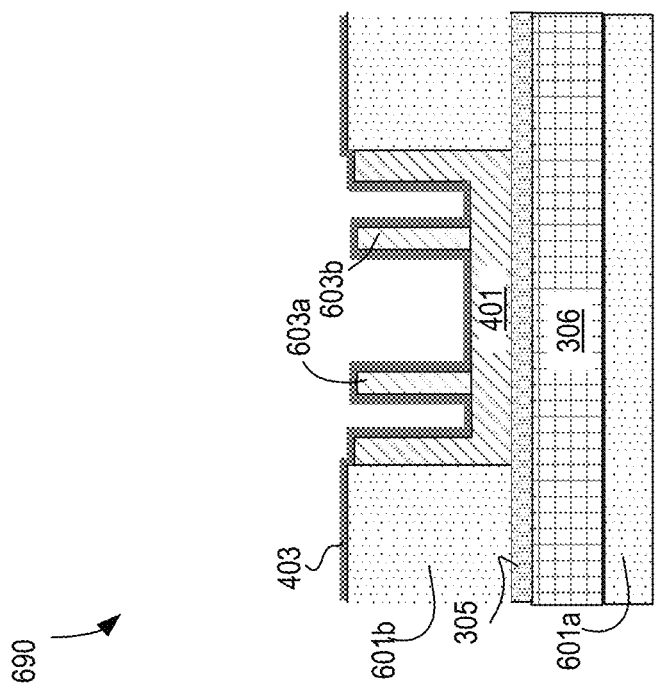
Figure 6L:
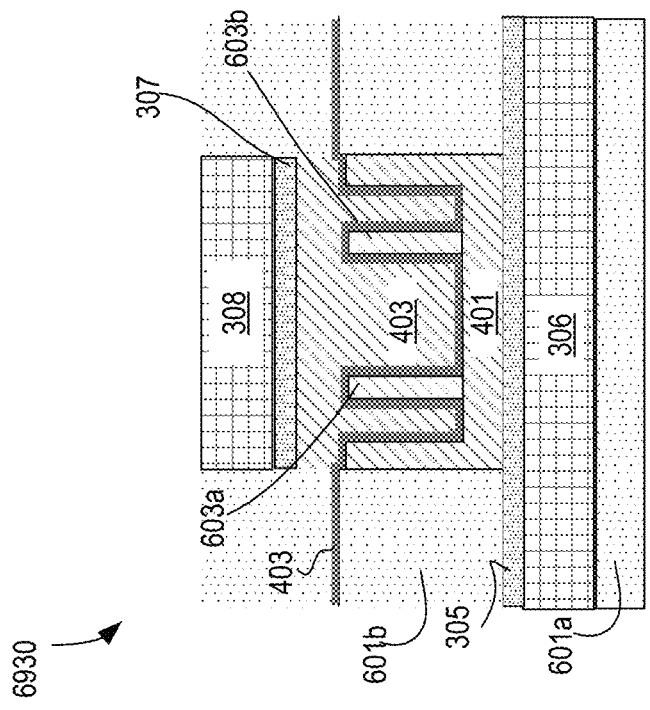
Figure 6K:
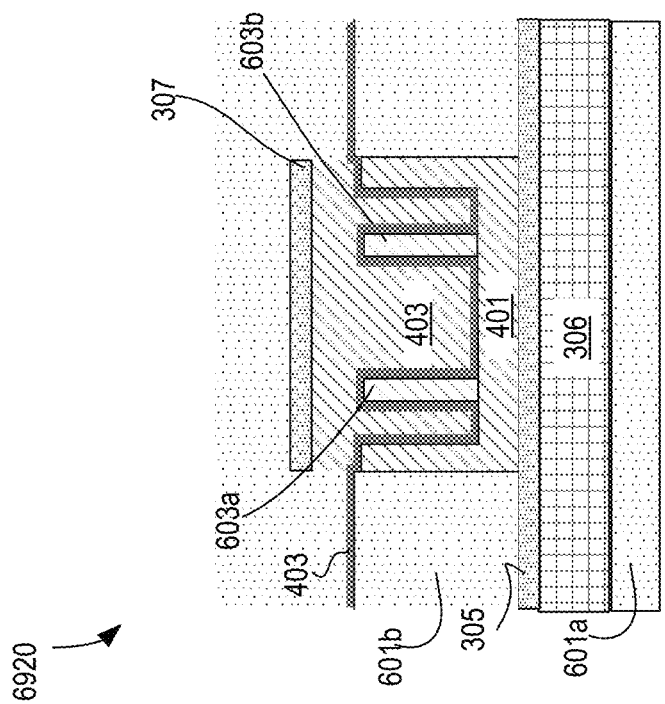

FIG. 5 illustrates a cross-section of an embedded dynamic random access memory (eDRAM) comprising COB with interdigitated ferroelectric structure, in accordance with some embodiments of the disclosure.

In some embodiments, transistor 500 has source region 502, drain region 504 and gate 506. Transistor 500 (e.g., n-type transistor M1) further includes gate contact 514 disposed above and electrically coupled to gate 506, source contact 516 disposed above and electrically coupled to source region 502, and drain contact 518 disposed above and electrically coupled to drain region 504. In various embodiments, COB 400 is disposed above transistor 500 such that electrode 308 is coupled to via or metal structure 508A, and electrode 306 is coupled to via 518.

In some embodiments, gate contact 514 is directly below COB 400. In some embodiments, word-line (WL) contact 570 is disposed onto gate contact 514 on second y-z plane behind (into the page) the first y-z plane metal 522a.

In some embodiments, transistor 500 associated with substrate 501 is a metal-oxide-semiconductor field-effect transistor (MOSFET or simply MOS transistors), fabricated on substrate 501. In various embodiments of the present disclosure, transistor 500 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. In an embodiment, the transistor 500 is a tri-gate transistor.

Here, COB 400 stores data. Data is written into COB 400 as charge via bit-line (BL) 540 when access transistor M1 is turned on by applying voltage on word-line WL 570. In some embodiments, underlying substrate 501 represents a surface used to manufacture integrated circuits. In some embodiments, substrate 501 includes a suitable semiconductor material such as but not limited to, single crystal silicon, polycrystalline silicon and silicon on insulator (SOI). In another embodiment, substrate 501 includes other semiconductor materials such as germanium, silicon germanium, or a suitable group III-V or group III-N compound. Substrate 501 may also include semiconductor materials, metals, dopants, and other materials commonly found in semiconductor substrates.

In some embodiments, transistor 500 includes a gate stack formed of at least two layers, gate dielectric layer 510 and gate electrode layer 512. Gate dielectric layer 510 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 510 to improve its quality when a high-k material is used.

Gate electrode layer 512 of transistor 500 is formed on gate dielectric layer 510 and may comprise of at least one P-type work-function metal or N-type work-function metal, depending on whether the transistor is to be a PMOS or an NMOS transistor. In some embodiments, gate electrode layer 512 may comprise of a stack of two or more metal layers, where one or more metal layers are work-function metal layers and at least one metal layer is a conductive fill layer.

For a PMOS transistor, metals that may be used for the gate electrode layer 512 include, but are not limited to, ruthenium, palladium, platinum, cobalt, nickel, and conductive metal oxides, e.g., ruthenium oxide. A P-type metal layer will enable the formation of PMOS gate electrode layer 512 with a work-function that is between about 4.9 eV and about 5.2 eV. For an NMOS transistor, metals that may be used for the gate electrode layer 512 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode layer 512 with a work-function that is between about 3.9 eV and about 4.2 eV.

In some embodiments, gate electrode layer 512 may comprise a "U"-shaped structure that includes a bottom portion substantially parallel to the surface of the substrate and two sidewall portions that are substantially perpendicular to the top surface of the substrate. In another embodiment, at least one of the metal layers that form gate electrode layer 512 may simply be a planar layer that is substantially parallel to the top surface of the substrate and does not include sidewall portions substantially perpendicular to the top surface of the substrate. In some embodiments of the present disclosure, gate electrode layer 512 may comprise of a combination of U-shaped structures and planar, non-U-shaped structures. For example, the gate electrode layer 512 may comprise of one or more U-shaped metal layers formed atop one or more planar, non-U-shaped layers.

In some embodiments, a pair of gate dielectric layer 510 may be formed on opposing sides of the gate stack that bracket the gate stack. Gate dielectric layer 510 may be formed from a material such as silicon nitride, silicon oxide, silicon carbide, silicon nitride doped with carbon, and silicon oxynitride. Processes for forming sidewall spacers are well-known in the art and generally include deposition and etching process operations. In some embodiments, a plurality of spacer pairs may be used, for instance, two pairs, three pairs, or four pairs of sidewall spacers may be formed on opposing sides of the gate stack.

In some embodiments, source region 502 and drain region 504 are formed within the substrate adjacent to the gate stack of transistor 500. Source region 502 and drain region 504 are generally formed using either an implantation/diffusion process or an etching/deposition process. In the former process, dopants such as boron, aluminum, antimony, phosphorous, or arsenic may be ion-implanted into the substrate to form the source region 502 and drain region 504. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate source region 502 and drain region 504. In some embodiments, source region 502 and drain region 504 may be fabricated using a silicon alloy such as silicon germanium or silicon carbide. In some embodiments, the epitaxially deposited silicon alloy may be doped in-situ with dopants such as boron, arsenic, or phosphorous. In some embodiments, source region 502 and drain region 504 may be formed using one or more alternate semiconductor materials such as germanium or a suitable group III-V compound. In some embodiments, one or more layers of metal and/or metal alloys may be used to form source region 502 and drain region 504.

In some embodiments, gate contact 514 and drain contact 518 of transistor 500 are disposed in first dielectric layer 520 disposed above substrate 501. In some embodiments, terminal B is disposed in second dielectric layer 522 disposed on first dielectric layer 520. In some embodiments, third dielectric layer 524 is disposed on second dielectric layer 522. In some embodiments, fourth dielectric layer 526 is disposed on third dielectric layer 524. In some embodiments, source contact 516 is partially disposed in fourth dielectric layer 526, partially disposed in third dielectric layer 524, partially disposed in second dielectric layer 522 and partially disposed on first dielectric layer 520. In some embodiments, terminal B contact is disposed in third dielectric layer 524. In some embodiments, the conductive interconnect structure such as conductive interconnect structure 508 disposed in fourth dielectric layer 526.

In the illustrated embodiment of FIG. 5, gate contract 514 is formed in poly region; drain contract 518 is formed in active, poly, and Metal 0 (M0); electrode 306 is formed in Via 0-1 layer; COB 400 is formed in Metal 1 (M1) and Via 1-2; electrode 308 is formed in Metal 2 (M2), and conductor 508 is formed in Via 2-3 and Metal (M3). In some embodiments, COB 300 is formed in the metal 3 (M3) region.

In some embodiments, an n-type transistor M1 is formed in the frontend of the die while COB 400 is located in the backend of the die. In some embodiments, COB 400 is located in the backend metal layers or via layers for example in Via 3. In some embodiments, the electrical connectivity to the device is obtained in layers M0 and M4 or M1 and M5 or any set of two parallel interconnects. In some embodiments, COB 400 is formed in metal 2 (M2) and metal 1 (M1) layer region and/or Via 1-2 region.

While the embodiment of FIG. 5 is illustrated with reference to a frontend transistor M1, eDRAM (embedded DRAM) cell can also be formed entirely in the backend. In some embodiments, access transistor M1 of the eDRAM cell may include a back end transistor that is coupled to ferroelectric capacitor 400 by sharing its source/drain terminal with one electrode of ferroelectric capacitor 400 and is used for both READ and WRITE access to ferroelectric capacitor 400.

FIGS. 6A-L illustrate cross-sections showing the process of fabricating a COB with interdigitated ferroelectric structure, according to some embodiments of the disclosure. Described is a process for making an ultra-dense ferroelectric memory. The memory is fabricated using a patterning method by that applies atomic layer deposition (ALD) with selective dry and/or wet etch to increase memory density at a given via opening.

Cross-section 600 illustrates a snapshot of the fabrication process after inter-layer dielectric (ILD) 601b (e.g., $SiO_2$) is etched for forming the COB. Here, bottom electrode 401 is formed by ALD. In this snapshot, first interconnect 306 and first barrier 305 are already formed using any suitable process, where first interconnect 306 is formed over ILD 601a. Materials for electrode 401 include materials such as TiN, TaN, and other similar materials (e.g., Ru, Ir, IrOx, Cu, RuOx, Mo, where 'x' is a number or fraction). Using the same process, material 602 is deposited over electrode 401. Material 602 comprises material SiN. Any suitable material that can be selectively etched (e.g., dry etched or wet etched) to electrode 401 can be used for material 602. Example materials for material 602 include: SiNx, AlOx, AlN, SiOx, and SiON, where 'x' is a number or fraction.

Cross-section 620 illustrates a snapshot of the fabrication process where material 602 is etched. For example, material 602 is etched along the x-axis using dry etch process such that electrode 401 is not etched. This leaves behind remaining sections of material 602 such as pillars 602a and 602b, which are adjacent to electrode 401.

Cross-section 630 illustrates a snapshot of the fabrication process where the electrode 603 is deposited using ALD over the exposed surface of first electrode 401. The material of second electrode 603 is same as material for first electrode 401, in accordance with various embodiments. Here, pillars 602a and 602b are adjacent to electrodes 401 and 603.

Cross-section 640 illustrates a snapshot of the fabrication process after the second electrode 603 is dry etched to expose the surface of first electrode 401. This leaves behind remaining sections of material 603 such as pillars 603a and 603b, which are adjacent to pillars 602a and 602b, respectively.

Cross-section 650 illustrates a snapshot of the fabrication process after pillars 602a and 602b are wet etched. This process prepares the COB structure to have additional surfaces.

Cross-section 660 illustrates a snapshot of the fabrication process after coating material 604 and dry etching of material 604 so that pillars 603a/b partially protrude out. Material 604 can be any oxide or carbon-based spin-on materials.

Cross-section 670 illustrates a snapshot of the fabrication process after wet etching of electrode 401. Here, the pillars of the bottom electrode (or first electrode 401), pillars 603a and 603b, and material 604 are recessed below ILD 601b.

Cross-section 680 illustrates a snapshot of the fabrication process after material 604 is removed.

Cross-section 690 illustrates a snapshot of the fabrication process after depositing ferroelectric material 403 over ILD 601b, first electrode 401, and pillars 603a/b. As such, comb-like structure for ferroelectric material 403 is formed having surfaces S1 and S2.

Cross-section 6900 illustrates a snapshot of the fabrication process after depositing second electrode material 403. Second electrode 403 can have the same material as first electrode 401. After depositing material for the second electrode 403, ILD 601b is deposited in some examples.

Cross-sections 6920 illustrates the case when second barrier material 307 is deposited over second electrode 403. Cross-section 6930 illustrates the process of depositing metal to form the second interconnect 308.

Figure 7:
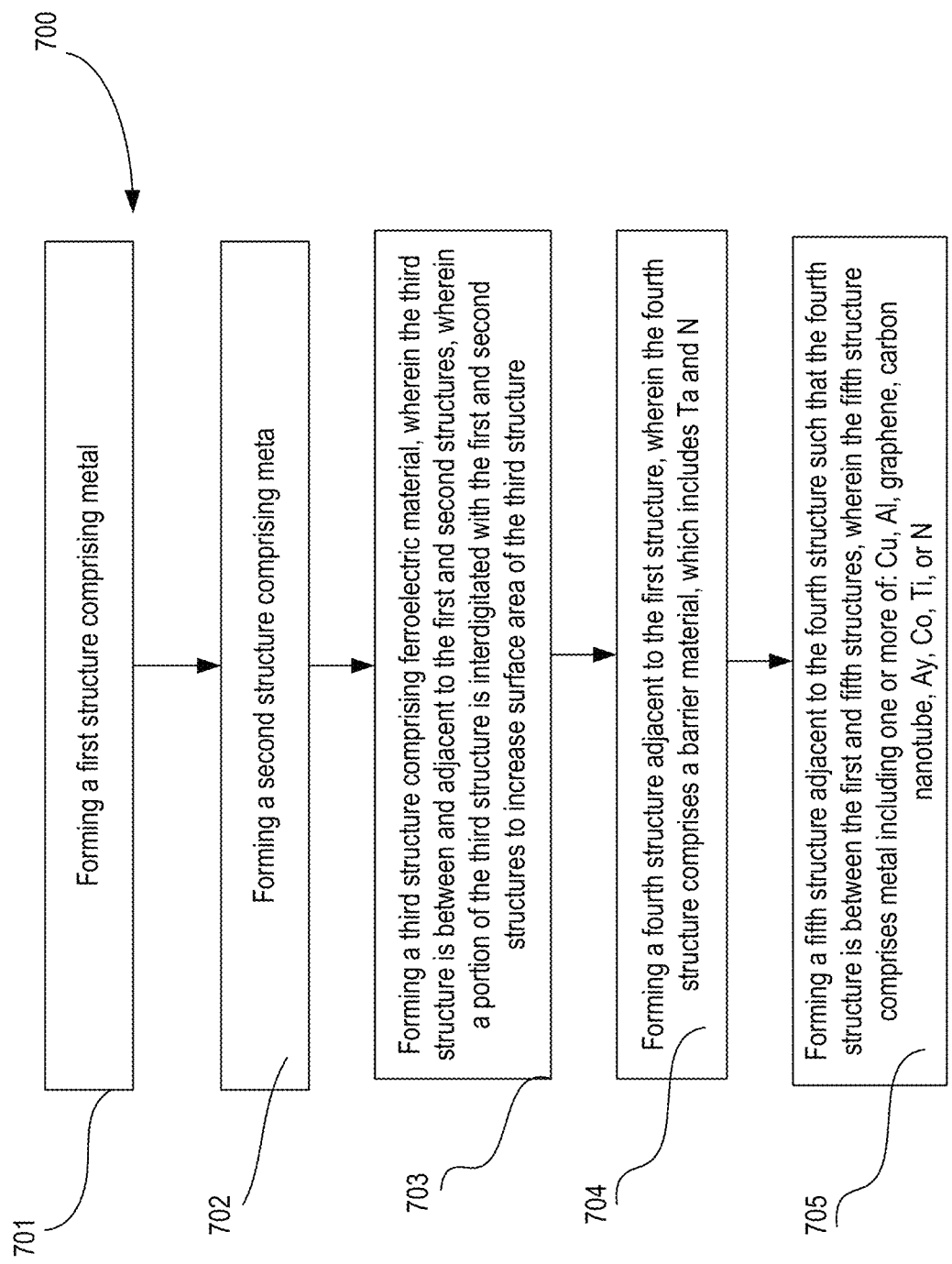
FIG. 7 illustrates a flowchart of a method for forming a COB with interdigitated FE, in accordance with some embodiments of the disclosure, in accordance with some embodiments.

FIG. 7 illustrates flowchart 700 of a method for forming a COB with interdigitated FE, in accordance with some embodiments of the disclosure, in accordance with some embodiments. While the following blocks (or process operations) in the flowchart are arranged in a certain order, the order can be changed. In some embodiments, some blocks can be executed in parallel.

At block 701, a first structure (e.g., 301) is formed comprising metal. At block 702, a second structure (e.g., 302) is formed comprising metal. At block 703, a third structure (e.g., 303) is formed comprising ferroelectric material. The third structure is between and adjacent to the first and second structures, wherein a portion of the third structure is interdigitated with the first and second structures to increase surface area of the third structure. The ferroelectric material includes one or more of: Hf or Zr. In another example, the ferroelectric material includes one or more of: Pb, Ti, Zr, Ba, N Si, La, Al, or Hf. At block 704, a fourth structure is formed adjacent to the first structure, wherein the fourth structure comprises a barrier material, which includes Ta and N. At block 705, a fifth structure is formed adjacent to the fourth structure such that the fourth structure is between the first and fifth structures, wherein the fifth structure comprises metal including one or more of: Cu, Al, graphene, carbon nanotube, Ay, Co, Ti, or N.

Figure 8:
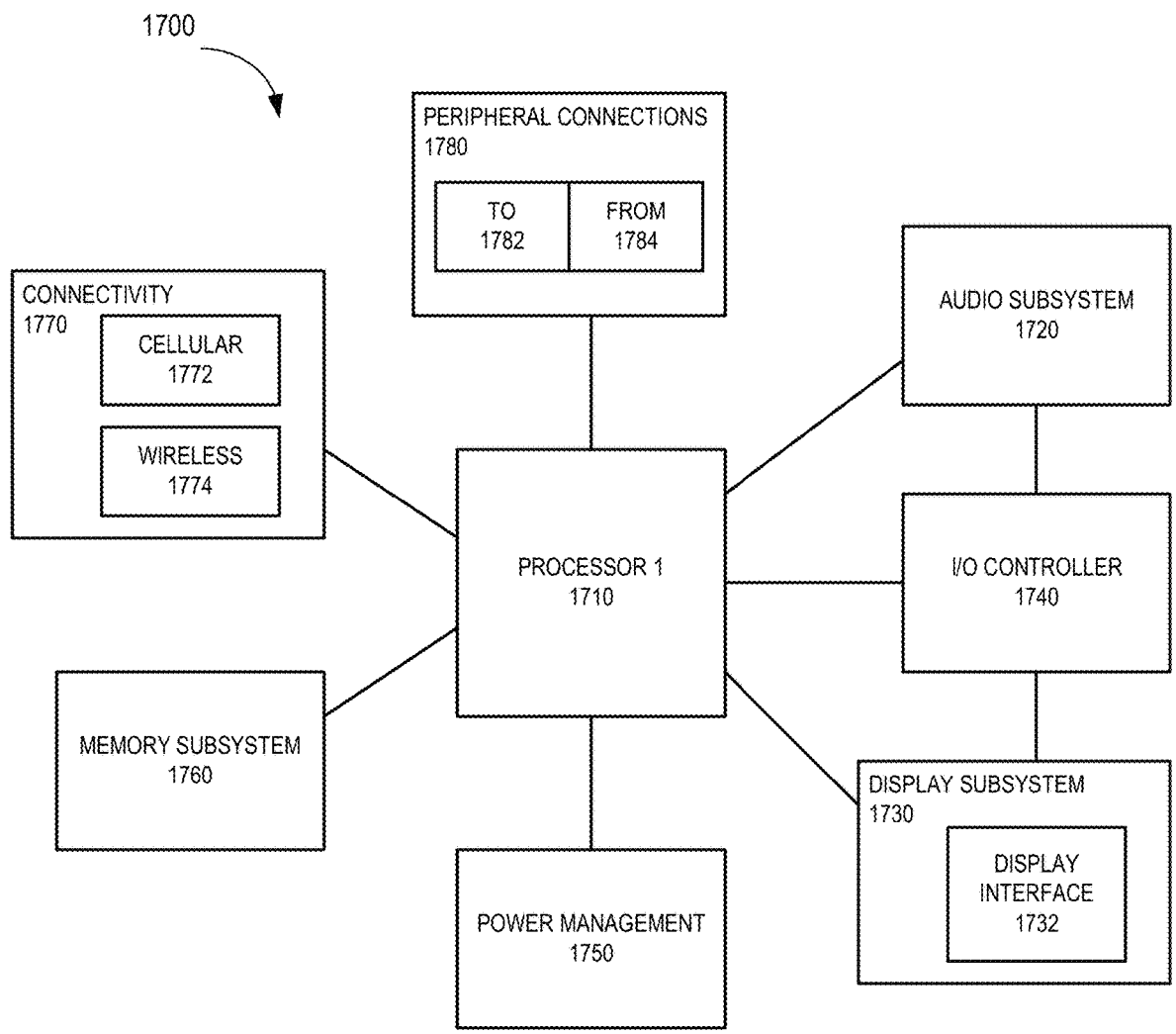
FIG. 8 illustrates a smart device, a computer system, or a SoC (System-on-Chip) including capacitor with interdigitated FE, in accordance with some embodiments of the disclosure.

FIG. 8 illustrates a smart device, a computer system, or a SoC (System-on-Chip) including capacitor with interdigitated FE, in accordance with some embodiments of the disclosure. FIG. 8 illustrates a block diagram of an embodiment of a mobile device in which flat surface interface connectors could be used. In some embodiments, computing device 1700 represents a mobile computing device, such as a computing tablet, a mobile phone or smart-phone, a wireless-enabled e-reader, or other wireless mobile device. It will be understood that certain components are shown generally, and not all components of such a device are shown in computing device 1700.

In some embodiments, computing device 1700 includes first processor 1710 with capacitor with interdigitated FE, according to some embodiments discussed. Other blocks of the computing device 1700 may also include capacitor with interdigitated FE, according to some embodiments. The various embodiments of the present disclosure may also comprise a network interface within 1770 such as a wireless interface so that a system embodiment may be incorporated into a wireless device, for example, cell phone or personal digital assistant.

In some embodiments, processor 1710 can include one or more physical devices, such as microprocessors, application processors, microcontrollers, programmable logic devices, or other processing means. The processing operations performed by processor 1710 include the execution of an operating platform or operating system on which applications and/or device functions are executed. The processing operations include operations related to I/O (input/output) with a human user or with other devices, operations related to power management, and/or operations related to connecting the computing device 1700 to another device. The processing operations may also include operations related to audio I/O and/or display I/O.

In some embodiments, computing device 1700 includes audio subsystem 1720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1700, or connected to the computing device 1700. In one embodiment, a user interacts with the computing device 1700 by providing audio commands that are received and processed by processor 1710.

In some embodiments, computing device 1700 comprises display subsystem 1730. Display subsystem 1730 represents hardware (e.g., display devices) and software (e.g., drivers) components that provide a visual and/or tactile display for a user to interact with the computing device 1700. Display subsystem 1730 includes display interface 1732, which includes the particular screen or hardware device used to provide a display to a user. In one embodiment, display interface 1732 includes logic separate from processor 1710 to perform at least some processing related to the display. In one embodiment, display subsystem 1730 includes a touch screen (or touch pad) device that provides both output and input to a user.

In some embodiments, computing device 1700 comprises I/O controller 1740. I/O controller 1740 represents hardware devices and software components related to interaction with a user. I/O controller 1740 is operable to manage hardware that is part of audio subsystem 1720 and/or display subsystem 1730. Additionally, I/O controller 1740 illustrates a connection point for additional devices that connect to computing device 1700 through which a user might interact with the system. For example, devices that can be attached to the computing device 1700 might include microphone devices, speaker or stereo systems, video systems or other display devices, keyboard or keypad devices, or other I/O devices for use with specific applications such as card readers or other devices.

As mentioned above, I/O controller 1740 can interact with audio subsystem 1720 and/or display subsystem 1730. For example, input through a microphone or other audio device can provide input or commands for one or more applications or functions of the computing device 1700. Additionally, audio output can be provided instead of, or in addition to display output. In another example, if display subsystem 1730 includes a touch screen, the display device also acts as an input device, which can be at least partially managed by I/O controller 1740. There can also be additional buttons or switches on the computing device 1700 to provide I/O functions managed by I/O controller 1740.

In some embodiments, I/O controller 1740 manages devices such as accelerometers, cameras, light sensors or other environmental sensors, or other hardware that can be included in the computing device 1700. The input can be part of direct user interaction, as well as providing environmental input to the system to influence its operations (such as filtering for noise, adjusting displays for brightness detection, applying a flash for a camera, or other features).

In some embodiments, computing device 1700 includes power management 1750 that manages battery power usage, charging of the battery, and features related to power saving operation. Memory subsystem 1760 includes memory devices for storing information in computing device 1700. Memory can include nonvolatile (state does not change if power to the memory device is interrupted) and/or volatile (state is indeterminate if power to the memory device is interrupted) memory devices. Memory subsystem 1760 can store application data, user data, music, photos, documents, or other data, as well as system data (whether long-term or temporary) related to the execution of the applications and functions of the computing device 1700.

Elements of embodiments are also provided as a machine-readable medium (e.g., memory 1760) for storing the computer-executable instructions (e.g., instructions to implement any other processes discussed herein). The machine-readable medium (e.g., memory 1760) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1700 comprises connectivity 1770. Connectivity 1770 includes hardware devices (e.g., wireless and/or wired connectors and communication hardware) and software components (e.g., drivers, protocol stacks) to enable the computing device 1700 to communicate with external devices. The computing device 1700 could be separate devices, such as other computing devices, wireless access points or base stations, as well as peripherals such as headsets, printers, or other devices.

Connectivity 1770 can include multiple different types of connectivity. To generalize, the computing device 1700 is illustrated with cellular connectivity 1772 and wireless connectivity 1774. Cellular connectivity 1772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1774 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1700 comprises peripheral connections 1780. Peripheral connections 1780 include hardware interfaces and connectors, as well as software components (e.g., drivers, protocol stacks) to make peripheral connections. It will be understood that the computing device 1700 could both be a peripheral device ("to" 1782) to other computing devices, as well as have peripheral devices ("from" 1784) connected to it. The computing device 1700 commonly has a "docking" connector to connect to other computing devices for purposes such as managing (e.g., downloading and/or uploading, changing, synchronizing) content on computing device 1700. Additionally, a docking connector can allow computing device 1700 to connect to certain peripherals that allow the computing device 1700 to control content output, for example, to audiovisual or other systems.

In addition to a proprietary docking connector or other proprietary connection hardware, the computing device 1700 can make peripheral connections 1780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples illustrate various embodiments. These examples can be combined with other examples in any suitable manner.

Example 1

An apparatus comprising: a first structure comprising metal; a second structure comprising metal; and a third structure comprising ferroelectric material, wherein the third structure is between and adjacent to the first and second structures, wherein a portion of the third structure is interdigitated with the first and second structures to increase surface area of the third structure.

Example 2

The apparatus of example 1 comprising a fourth structure adjacent to the first structure, wherein the fourth structure comprises a barrier material, which includes one or more of: Ta, N, Ru, Ir, Cu, Ru, or Mo.

Example 3

The apparatus of example 1 comprising a fifth structure adjacent to the fourth structure such that the fourth structure is between the first and fifth structures, wherein the fifth structure comprises metal including one or more of: Cu, Al, graphene, carbon nanotube, Ay, Co, Ti, or N.

Example 4

The apparatus of example 1, wherein the ferroelectric material includes one or more of: Hf or Zr.

Example 5

The apparatus of example 1, wherein the ferroelectric material includes one or more of: Pb, Ti, Zr, Ba, N Si, La, Al, or Hf.

Example 6

An apparatus comprising: a bit-line; a word-line; a transistor coupled to the bit-line and the word-line; and a capacitor over the bit-line (COB), wherein the COB is coupled to ground and the transistor, wherein the COB comprises: a first structure comprising metal; a second structure comprising metal; and a third structure comprising ferroelectric material, wherein the third structure is between and adjacent to the first and second structures, wherein a portion of the third structure is interdigitated with the first and second structures to increase surface area of the third structure.

Example 7

The apparatus of example 6 comprising a first barrier structure adjacent to the first electrode, wherein the second barrier structure comprises Ta and N.

Example 8

The apparatus of example 7 comprising a second barrier structure adjacent to the second electrode, wherein the second barrier structure comprises Ta and N.

Example 9

The apparatus of example 8 comprising a first interconnect adjacent to the first barrier.

Example 10

The apparatus of example 9 comprising a second interconnect adjacent to the second barrier.

Example 11

The apparatus of example 10, wherein the first and second interconnect comprise metal including one or more of: Cu, Al, graphene, carbon nanotube, Ay, Co, Ti, or N.

Example 12

The apparatus of example 6, wherein the ferroelectric material includes one or more of: Hf or Zr.

Example 13

The apparatus of example 6, wherein the ferroelectric material includes one or more of: Pb, Ti, Zr, Ba, N Si, La, Al, or Hf.

Example 14

A system comprising: a processor; a memory coupled to the processor, wherein the memory includes a structure between two electrodes, wherein the structure comprises a folded pattern which interdigitates with the two electrodes, and wherein the structure comprises ferroelectric material; and a wireless interface to allow the processor to communicate with another device.

Example 15

The system of example 14, wherein the two electrodes comprise metal including one or more of: Cu, Al, graphene, carbon nanotube, Ay, Co, Ti, or N.

Example 16

The system of example 14, wherein the ferroelectric material includes oxides of one or more of: Hf or Zr.

Example 17

The system of example 14, wherein the memory comprises an embedded dynamic access memory, and wherein the structure is coupled to a transistor.

Example 18

The system of example 14, wherein the structure is a capacitor over bit-line (COB).

Example 19

The system of example 14, wherein the structure is position in a backend of a die.

Example 20

The system of example 14, wherein the two electrodes are a first electrode and a second electrode, wherein the system further comprising: a first barrier structure adjacent to the first electrode, wherein the second barrier structure comprises Ta and N; a second barrier structure adjacent to the second electrode, wherein the second barrier structure comprises Ta and N; a first interconnect adjacent to the first barrier; and a second interconnect adjacent to the second barrier, wherein the first and second interconnect comprise metal including one or more of: Cu, Al, graphene, carbon nanotube, Ay, Co, Ti, or N.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a dielectric layer over an interconnect, the dielectric layer comprising an opening, the opening defined by a sidewall of the dielectric layer and a portion of a barrier layer over the interconnect within the opening;
   a first electrode structure comprising metal, the first electrode structure within the opening and conformal to the sidewall of the dielectric layer and the barrier layer within the opening;
   a second electrode structure comprising metal, the second electrode structure comprising a pillar on the first electrode structure and within the opening;
   a third structure comprising ferroelectric material on and conformal to surfaces of the first and second electrode structures; and
   a third electrode structure comprising metal, the third electrode structure on the third structure, wherein the third structure is between the third electrode structure and the surfaces of the first and second electrode structures, and wherein a portion of the third electrode structure is interdigitated with the first and second electrode structures.

2. The apparatus of claim 1, wherein the barrier layer comprises Ta, N, Ru, 1r, Cu, Ru, or Mo.

3. The apparatus of claim 1, further comprising a second barrier layer on the third electrode structure, and a second interconnect on the second barrier layer.

4. The apparatus of claim 1, wherein the ferroelectric material comprises Hf or Zr.

5. The apparatus of claim 1, wherein the ferroelectric material comprises Pb, Ti, Zr, Ba, N Si, La, Al, or Hf.

6. An apparatus comprising:
   a bit-line;
   a word-line;
   a transistor coupled to the bit-line and the word-line; and
   a capacitor over the bit-line (COB), wherein the COB is coupled to ground and the transistor, wherein the COB comprises:
   a dielectric layer over an interconnect, the dielectric layer comprising an opening, the opening defined by a sidewall of the dielectric layer and a portion of a barrier layer over the interconnect within the opening;
   a first electrode structure comprising metal, the first electrode structure within the opening and conformal to the sidewall of the dielectric layer and the barrier layer within the opening;
   a second electrode structure comprising metal, the second electrode structure comprising a pillar on the first electrode structure and within the opening;
   a third structure comprising ferroelectric material on and conformal to surfaces of the first and second electrode structures; and
   a third electrode structure comprising metal, the third electrode structure on the third structure, wherein the third structure is between the third electrode structure and the surfaces of the first and second electrode structures, and wherein a portion of the third electrode structure is interdigitated with the first and second electrode structures.

7. The apparatus of claim 6, wherein the barrier layer structure comprises Ta and N.

8. The apparatus of claim 7, further comprising a second barrier layer on the third electrode structure, and a second interconnect on the second barrier layer.

9. The apparatus of claim 8, wherein a sidewall of the second interconnect is aligned with the sidewall of the dielectric layer.

10. The apparatus of claim 9, further comprising a second dielectric layer adjacent to the second sidewall of the second interconnect.

11. The apparatus of claim 8, wherein the first and second interconnects comprise Cu, Al, graphene, carbon nanotubes, Co, Ti, or N.

12. The apparatus of claim 6, wherein the ferroelectric material comprises Hf or Zr.

13. The apparatus of claim 6, wherein the ferroelectric material comprises Pb, Ti, Zr, Ba, N, Si, La, Al, or Hf.

14. A system comprising:
a processor;
a memory coupled to the processor, wherein the memory comprises a capacitor comprising:
  a dielectric layer over an interconnect, the dielectric layer comprising an opening, the opening defined by a sidewall of the dielectric layer and a portion of a barrier layer over the interconnect within the opening;
  a first electrode structure comprising metal, the first electrode structure within the opening and conformal to the sidewall of the dielectric layer and the barrier layer within the opening;
  a second electrode structure comprising metal, the second electrode structure comprising a pillar on the first electrode structure and within the opening;
  a third structure comprising ferroelectric material on and conformal to surfaces of the first and second electrode structures; and
  a third electrode structure comprising metal, the third electrode structure on the third structure, wherein the third structure is between the third electrode structure and the surfaces of the first and second electrode structures, and wherein a portion of the third electrode structure is interdigitated with the first and second electrode structures; and
a wireless interface to allow the processor to communicate with another device.

15. The system of claim 14, wherein the first, second, and third electrode structures comprise Cu, Al, graphene, carbon nanotubes, Co, Ti, or N.

16. The system of claim 14, wherein the ferroelectric material comprises O and Hf or Zr.

17. The system of claim 14, wherein the memory comprises an embedded dynamic access memory, and wherein the capacitor is coupled to a transistor.

18. The system of claim 14, wherein the capacitor is over a bit-line.

19. The system of claim 14, wherein the capacitor is positioned in a backend of a die.

20. The system of claim 14, further comprising:
a second barrier layer on the third electrode structure, wherein the barrier layer and the second barrier layer comprises Ta and N; and
a second interconnect on the second barrier layer, wherein the interconnect and the second interconnect comprise Cu, Al, graphene, carbon nanotubes, Co, Ti, or N.

* * * * *